United States Patent
Misiano et al.

[11] Patent Number: 6,136,167
[45] Date of Patent: Oct. 24, 2000

[54] PORTABLE APPARATUS FOR THIN DEPOSITION

[75] Inventors: Carlo Misiano; Enrico Simonetti, both of Rome, Italy

[73] Assignee: CE.TE.V Centro Technologie Del Vuoto, Carsoli, Italy

[21] Appl. No.: 09/247,474

[22] Filed: Feb. 8, 1999

[30] Foreign Application Priority Data

Feb. 6, 1998 [IT] Italy .................................. RM98A0071

[51] Int. Cl.[7] .................................................. C23C 16/00
[52] U.S. Cl. .................................... 204/298.23; 118/723 VE; 204/298.23
[58] Field of Search .................................... 118/715, 719, 118/723 E, 733; 204/298.02, 298.16, 298.19, 298.07, 298.06, 298.23, 298.24; 427/140, 142

[56] References Cited

U.S. PATENT DOCUMENTS

| | | | |
|---|---|---|---|
| 4,514,275 | 4/1985 | Shimada et al. ......................... | 204/298 |
| 4,941,915 | 7/1990 | Matsuoka et al. .................. | 204/298.12 |
| 4,946,576 | 8/1990 | Dietrich et al. ..................... | 204/298.23 |
| 5,372,693 | 12/1994 | Brauer et al. ....................... | 204/298.23 |

*Primary Examiner*—Shrive Beck
*Assistant Examiner*—Sylvia R. MacArthur
*Attorney, Agent, or Firm*—Herbert Dubno

[57] ABSTRACT

An apparatus for thin film deposition on fixed objects can be carried out using a portable vacuum deposition plant having a forechamber surrounding the deposition chamber and in which a process gas chamber slightly higher than that of the deposition chamber is maintained. The forechamber and the deposition chamber can be separately evacuated and vacuum seals can be provided between the chambers and the substrate. The source of the coating material may include a sputtering magnetron and a grid can be provided between the magnetron and the substrate.

6 Claims, 4 Drawing Sheets

PORTABLE APPARATUS FOR THIN DEPOSITION

FIELD OF THE INVENTION

The present invention relates to a portable apparatus for thin film deposition and, more particularly, for the deposition of thin films of materials on surfaces of substrates which can be immobile, for example, tools, gun barrels, transmission gearing and axles of large dimensions and the like.

BACKGROUND OF THE INVENTION

It is known to provide thin film coatings on substrates, for example metal substrates, by the deposition of the coating material from a plasma by plasma sputtering or the like. Such processes have generally required the use of a fixed apparatus located at the coating facility and hence the transport of the articles to be coated to the apparatus and the insertion of the articles into a coating chamber and removal of the coated articles from the coating chamber.

Such coatings are widely used for tribological treatments, i.e. treatments which decrease the coefficient of friction and coatings which protect the surfaces from environmental deterioration or wear.

OBJECTS OF THE INVENTION

It is the principal object of the present invention to provide an improved apparatus for carrying out thin film coating of substrates, especially metal substrates, which can be too large to transport to a coating chamber or a vacuum treatment chamber of conventional design.

Another object of the invention is to provide an improved apparatus for use in thin film vacuum deposition on a substrate, whereby drawbacks of earlier systems are avoided.

Still another object is to provide a highly portable apparatus for thin film deposition, especially on articles which are not transportable or which are transportable only with difficulty, e.g. on so-called immobile surfaces.

SUMMARY OF THE INVENTION

These objects are attained, in accordance with the invention in an apparatus which comprises:
  means forming a forechamber having an opening at a side thereof turned in a direction and adapted to be applied in the direction to a substrate for coating the substrate with a thin film, the forechamber being provided with:
    a vacuum seal surrounding the opening and adapted to press against the substrate,
    means for connecting the forechamber to a vacuum pump, and
    means for connecting the forechamber to a source of a process gas;
  means forming a deposition chamber within the forechamber and connected thereto, the deposition chamber having an opening in the direction toward the substrate, the deposition chamber being provided with:
    a vacuum seal surrounding the opening of the deposition chamber and adapted to press against the substrate,
    means for connecting the deposition chamber to a vacuum pump, and
    means for connecting the deposition chamber to a source of a process gas; and
  means in the deposition chamber for generating a plasma whereby a thin-film coating is applied to the substrate.

Specifically, the means for generating the plasma can comprise a grid mounted in the deposition chamber, a magnetron positioned on a side of the grid opposite the substrate, and respective voltage sources for the grid and the magnetron whereby a plasma is formed adjacent to the magnetron on one side of the grid and another plasma is formed between the grid and the substrate.

Alternatively, the means in the deposition chamber for generating the plasma can comprise a magnetron for producing a first plasma adjacent the magnetron, a pair of spaced apart electrodes forming a medium frequency plasma between them and a grid between the electrodes and the substrate for forming a third plasma between the grid and the substrate, respective voltage sources being provided to engage the magnetron, the electrodes and the grid.

In still another alternative, the plasma generating means can comprise a magnetron, and a voltage source connected to the magnetron for energizing same, the forechamber being provided with an anodic electrode.

In the latter case, the apparatus also can comprise a grid between the magnetron and the substrate, another plasma being formed between the grid and the substrate.

More particularly, the portable vacuum plant or apparatus for thin film deposition on a metal substrate has a structure which allows vacuum deposition even on surfaces which are not planar and can be of various configurations, the apparatus being used in addition for the polarization, partial ionization and energization of the material to be deposited. The forechamber surrounding the deposition chamber can receive a process gas or gaseous atmosphere identical to that maintained in the deposition chamber or similar thereto, this forechamber having a slightly greater pressure than that which is maintained in the deposition chamber so that undesired gases or gases detrimented to the deposition process cannot pass from the ambient into the deposition chamber and, conversely, losses of process gas from the deposition chamber to the atmosphere are minimized.

The apparatus can carry out a plasma-assisted ion plating even when the substrate to be treated is electrically grounded. In the conventional ion plating technique, to energize particles of the material to be deposited, these particles are partially ionized and so accelerated toward the substrate, which is poled relatively negatively.

In the system of the invention, the inner wall of the deposition chamber itself can be poled relatively positively with respect to the substrate. This allows maintenance of an ionizing plasma directly in juxtaposition with the substrate, e.g. with a grid.

The local treatment of immovable surfaces has been effected in the past primarily by galvanic processes, utilizing an electrolyte in contact with the surface to be coated. The coating can be, for example, a chromium plating, nickel plating or cadmium plating, all of which are less satisfactory than the coating operations which can be obtained by truly effective vacuum deposition techniques. Furthermore, the vacuum deposition technique of the invention avoids the environmental polluting effects of such galvanic process and also can avoid endangering the operator of the process.

German Patent DE 43 13 353 A1 discloses a local deposition chamber but one which is substantially different with respect to the sealing and deposition approaches.

BRIEF DESCRIPTION OF THE DRAWING

The above and other objects, features, and advantages will become more readily apparent from the following description, reference being made to the accompanying drawing in which.

SPECIFIC DESCRIPTION

Figure 1:
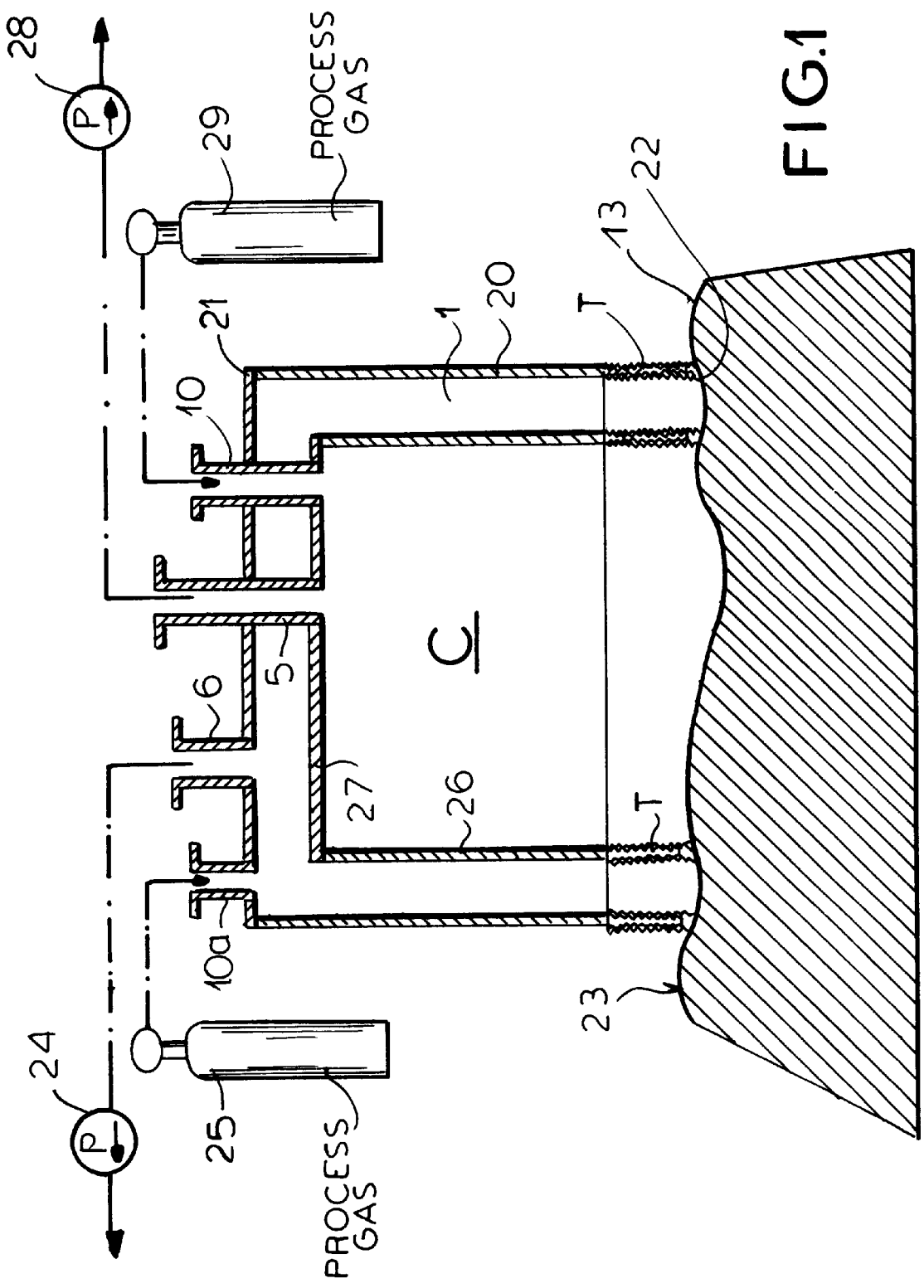
FIG. 1 is a cross sectional view of a portable deposition apparatus in which the means for generating the plasma has not been illustrated in the deposition chamber but can be any of the systems of FIGS. 2 to 4.

The basic apparatus of the invention comprises a forechamber 1 having a wall 20 formed with a closed side 21 and an open side 22, the latter being provided with an annular vacuum seal T which is pressed with the forechamber against a surface 23 of a substrate 13 to be coated. The seal T can be somewhat yieldable to allow the forechamber to accommodate itself to any contour of the surface 23. The forechamber 1 is provided with a flange fitting or connection 6 communicating with a vacuum pumping system represented by the vacuum pump 24 and with a flange fitting or connection 10a connectable to a source of process gas, here represented by the tank 25.

Surrounded by the wall 20 and within the forechamber 1 there is provided a wall 26 surrounding a deposition chamber C, the open side of which is provided with another annular seal T which can be flexible to accommodate itself to the contours to the surface 23. The closed side 27 of the deposition chamber C is provided with the connection 5 to a vacuum pumping system 28, set to draw a deeper vacuum than that in the forechamber 1. Stated otherwise, the forechamber 1 is at a subatmospheric pressure which is greater than the subatmosphereic pressure in the deposition chamber C. Process gas can be admitted via the fitting or connection 10 to the deposition chamber from a source such as the tank 29.

In operation, a source of a material to be vapor deposited, for example, a metal is provided within the deposition chamber C and, if desired, a plasma can be created therein as described in connection with any of FIGS. 2 to 4. The vacuum drawn in the chamber C is deeper than the vacuum in forechamber 1 so that, where the process gas in the forechamber is the same as the process gas in the deposition chamber, any leakage into the deposition chamber is predominantly the same process gas as is admitted thereto.

As a result, the deposition efficiency in the deposition chamber is not adversely effected and high quality ion-plating or plasma-assist vapor deposition can be carried out.

Figure 2:
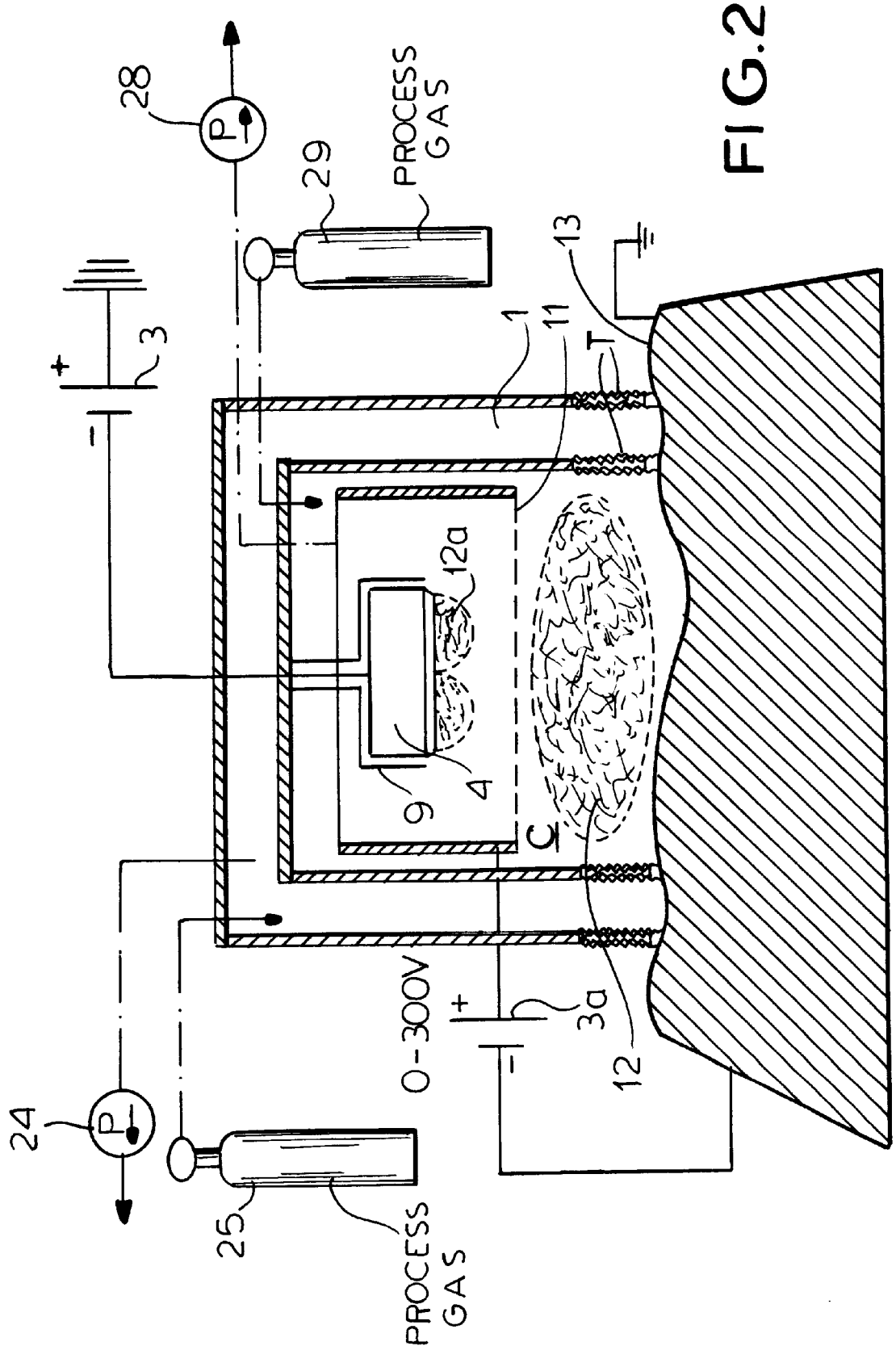
FIG. 2 is a similar view of a deposition apparatus using a magnetron system as the source of a component of the film to be deposited and a grid for generating the second plasma.

In FIG. 2, similar reference numerals have been used to indicate correspondingly forming elements. Here, the source is a magnetron 4 adjacent which a first plasma 12a is formed and at which, by magnetron sputtering, ions of a metal capable of reacting with a component of the process gas, for example, nitrogen, can be generated, the resulting metal nitride being deposited ultimately on the substrate 13. A second plasma is generated between a grid 11 and the substrate. The grid 11 is energized by a voltage source represented diagrammatically at 3a while the magnetron is energized by another voltage source represented at 3.

In the system of FIG. 2, the first plasma 12a serves as the source of the compound to be deposited and the second plasma 12 partly activates the surface on which the deposition is to be effected. Because of the portable nature of the apparatus shown in FIGS. 1 and 2, the apparatus can be placed against any surface capable of receiving a vacuum deposition coating and coated under the conditions previously described.

Figure 3:
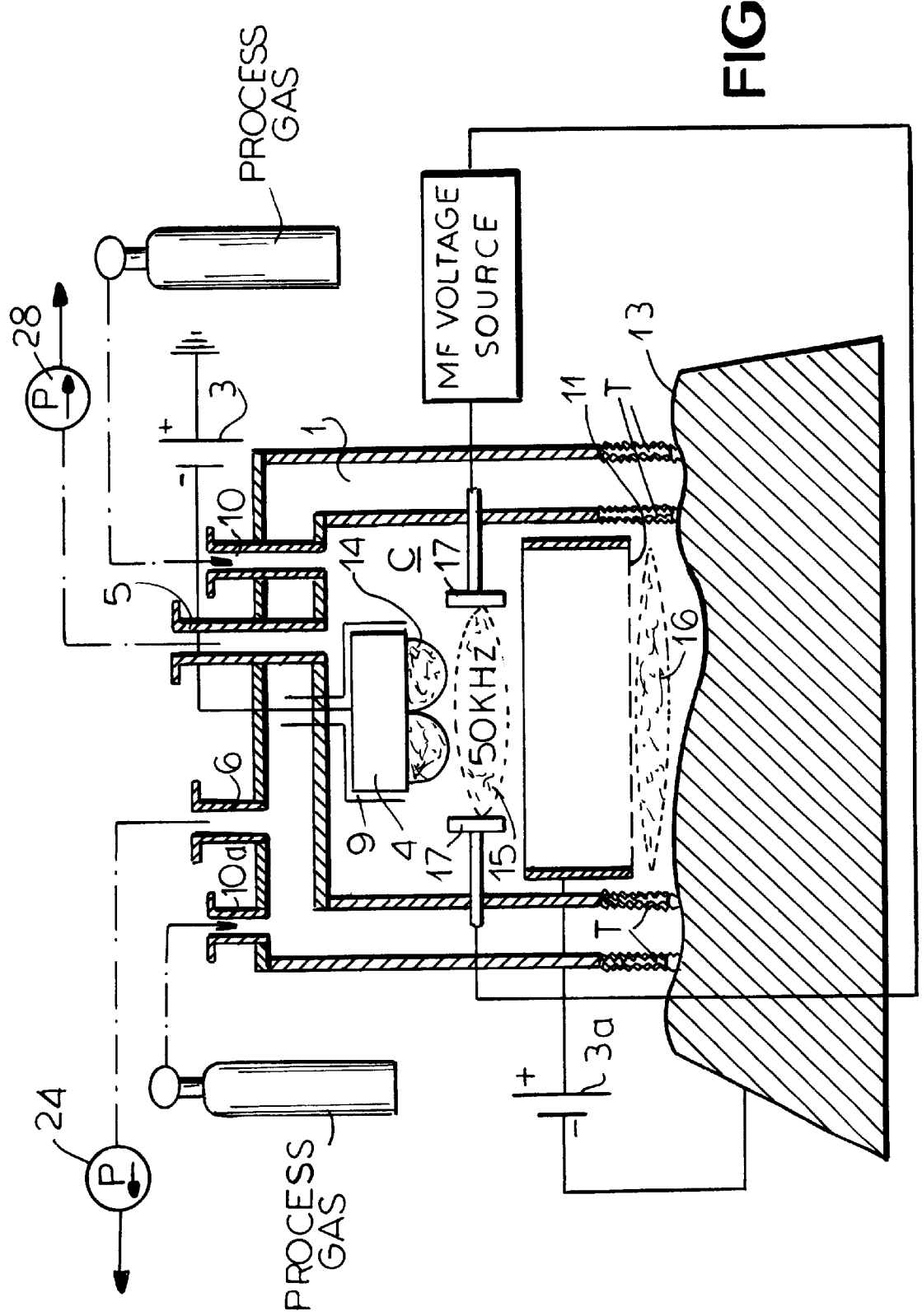
FIG. 3 is a cross sectional view through a similar apparatus in which, however, three plasmas are generated.

In the embodiment of FIG. 3, not only is the plasma 16 generated between the grid 11 and the substrate 13 and a plasma 4 formed at the magnetron, but an intermediate frequency plasma 15 is generated between electrodes 17 which can be connected to a medium frequency voltage source operating at, for example, 50 KHz. Wherever a magnetron is provided (see FIGS. 2 to 4), an isolator 7 can also be provided.

Figure 4:
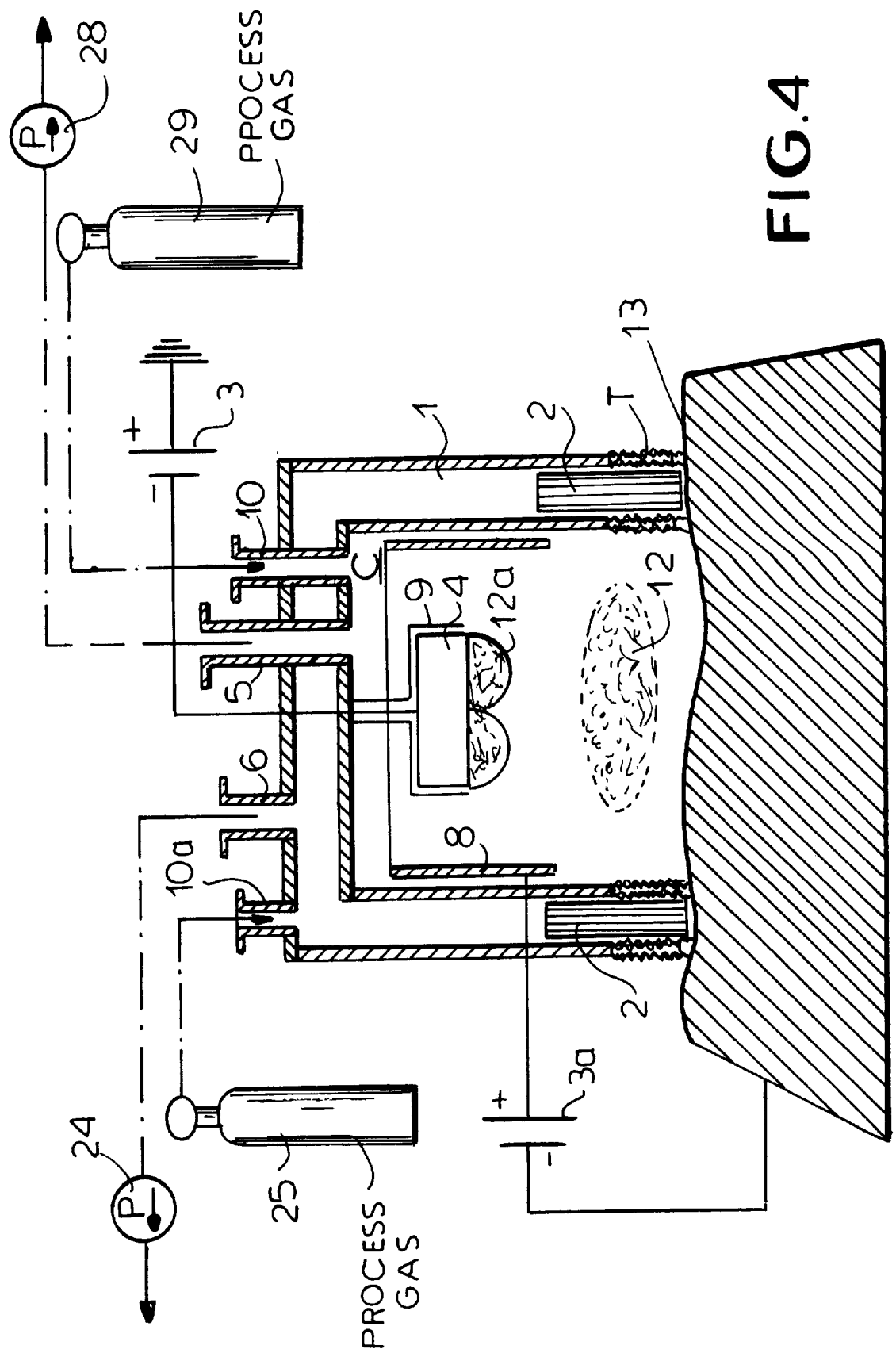
FIG. 4 is a cross sectional view through still another embodiment of a portable deposition apparatus wherein, in addition, an anodic electrode is provided in the forechamber.

The apparatus of FIG. 3 operates in the same basic manner as that of FIG. 4, the third plasma 15 corresponding the accounting of ionization of the material vaporized by the sputtering source 4, 9 and 14. The vaporization can be an arc source or thermal source. In the embodiment of FIG. 4, instead of the grid for generating the second plasma 12, an anodic electrode 8 is connected to the source 3a and, surrounding the chamber C and within the forechamber 1, magnets 2 are provided. Hereto, reference numerals similar to those of FIG. 1 are used to indicate similarly functioning elements.

The seals T of the embodiments described, serve to prevent air input and loss of gas.

By way of example, the reactive deposition of titanium nitride on a metal forming tool which may not be flat can be carried out with the apparatus described.

After a preliminary cleaning of the area of the substrate 13 to be coated, the double seal assembly shown in FIGS. 1 through 4 is placed on the article and the chamber C and the forechamber 1 can each be sealed against the substrate via the seals T. Vacuums are drawn by the pumping system and then the forechamber 1 can be filled with argon to a pressure of say $10^{-1}$ torr. The deposition chamber is then filled with argon to a typical pressure of $10^{-2}$ torr.

Oxygen is then admitted at a pressure of $10^{-4}$ torr and a plasma is generated between the grid or anodic electrode and the substrate to effect an ionic/chemical cleaning of the surface. The oxygen flow is then halted and a flow of nitrogen into the chamber C is initiated while the magnatron, as a sputtering source is vaporizing titanium. The vaporized titanium reacts with the nitrogen to form titanium nitride which deposits on the substrate. The deposition process can be regulated by carefully controlling the grid bias, the partial pressure of nitrogen and the rate of titanium vaporization. Special control equipment is not required.

We claim:

1. A portable apparatus for thin film deposition on a substrate, comprising:

means forming a forechamber having an opening at a side thereof turned in a direction and adapted to be applied in said direction to a substrate for coating said substrate with a thin film, said forechamber being provided with:
a vacuum seal surrounding said opening and adapted to press against said substrate,
means for connecting said forechamber to a vacuum pump, and
means for connecting said forechamber to a source of a process gas;

means forming a deposition chamber within said forechamber and connected thereto, said deposition chamber having an opening in said direction toward said substrate, said deposition chamber being provided with:
a vacuum seal surrounding said opening of said deposition chamber and adapted to press against said substrate, means for connecting said deposition chamber to a vacuum pump, means in said deposition chamber for producing a vapor of a material to be deposited on said substrate, and means for connecting said deposition chamber to a source of a process gas; and means in said deposition chamber for generating a plasma adjacent said substrate and between said means for producing said vapor and said substrate whereby a thin-film coating is applied by plasma-assisted ion plating to the substrate.

2. The apparatus defined in claim 1 wherein said means in said deposition chamber is generating said plasma includes:

a grid mounted in said deposition chamber, a magnetron positioned on a side of said grid opposite said substrate, and respective voltage sources for said grid and said magnetron whereby a plasma is formed adjacent to said magnetron on one side of said grid and another plasma is formed between said grid and said substrate.

3. The portable apparatus defined in claim 1 wherein said means in said deposition chamber for generating said plasma comprises a magnetron for producing a first plasma adjacent said magnetron, a pair of spaced apart electrodes forming a medium frequency plasma between them and a grid between said electrodes and said substrate for forming a third plasma between said grid and said substrate, respective voltage sources being provided to engage said magnetron, said electrodes and said grid.

4. A portable apparatus for thin film deposition on a substrate, comprising:

means forming a forechamber having an opening at a side thereof turned in a direction and adapted to be applied in said direction to a substrate for coating said substrate with a thin film, said forechamber being provided with:

a vacuum seal surrounding said opening and adapted to press against said substrate, means for connecting said forechamber to a vacuum pump, and means for connecting said forechamber to a source of a process gas;

means forming a deposition chamber within said forechamber and connected thereto, said deposition chamber having an opening in said direction toward said substrate, said deposition chamber being provided with:

a vacuum seal surrounding said opening of said deposition chamber and adapted to press against said substrate, means for connecting said deposition chamber to a vacuum Pump, and means for connecting said deposition chamber to a source of a process gas; and means in said deposition chamber for generating a plasma whereby a thin-film coating is applied by plasma-assisted ion plating to the substrate said means in said deposition chamber for generating said plasma including a magnetron, and a voltage source connected to said magnetron for energizing same, said forechamber being provided with an anodic electrode with respect to which said substrate is maintained relatively negative.

5. The portable apparatus defined in claim 4 further comprising a grid between said magnetron and said substrate, another plasma being formed between said grid and said substrate.

6. The portable apparatus defined in claim 1 wherein said means for generating a plasma includes a magnetron forming a source for a component of the coating applied to the substrate, and an isolator for said magnetron.

\* \* \* \* \*